United States Patent [19]

Nojima et al.

[11] Patent Number: 5,352,978
[45] Date of Patent: Oct. 4, 1994

[54] APPARATUS FOR SENSING A MAGNETIC FIELD WITH A SUPERCONDUCTIVE MATERIAL

[75] Inventors: Hideo Nojima; Hidetaka Shintaku; Masayoshi Koba, all of Nara, Japan

[73] Assignee: Sharp Kabushiki Kaisha, Osaka, Japan

[21] Appl. No.: 34,877

[22] Filed: Mar. 19, 1993

Related U.S. Application Data

[60] Division of Ser. No. 773,765, Oct. 10, 1991, Pat. No. 5,254,945, which is a continuation of Ser. No. 544,899, Jun. 28, 1990, abandoned.

[30] Foreign Application Priority Data

Jun. 30, 1989 [JP] Japan ................................. 1-170303
Jun. 30, 1989 [JP] Japan ................................. 1-170306

[51] Int. Cl.$^5$ .................. G01R 33/035; G01R 33/06; H01L 39/12; H01L 39/16
[52] U.S. Cl. ..................... 324/248; 324/262; 324/252; 307/306; 505/845; 505/701
[58] Field of Search .............. 324/244, 248–252, 324/260–263; 505/841–848, 701, 705, 706, 711, 702, 703; 307/306; 338/325

[56] References Cited

U.S. PATENT DOCUMENTS 5,011,818  9/1991  Katoka et al. ................. 324/248

FOREIGN PATENT DOCUMENTS 262879  6/1988  European Pat. Off. .
315359  9/1956  Switzerland .

OTHER PUBLICATIONS

Japanese Journal of Applied Physics, vol. 27, No. 5, 1988 pp. 746–750, Tokyo, JP: H. Nojima, et al. titled "Galvanomagnetic Effect of an Y-Ba-Cu-O Ceramic Superconductor and its Application to Magnetic Sensors".
IBM Technical Disclosure Bulletin, vol. 32, No. 5A, 1989, pp. 236–237.
Japanese Journal of Applied Physics, vol. 26, No. 7, Jul., 1987, pp. 1050–1055.
R&D Association for Future Electron Devices, Jun. 7–9, 1989 in Shikabe, Hokkaido, Japan, pp. 375–378.
FED HiTcSc-ED Workshop, Jun. 2–4, 1988, Miyagi-Zao, pp. 231–234.
Novel Magnetic Sensor Using Y–Ba–Cu–O Ceramic Superconductor Super Magneto-Resistor IEDM 87-867-868.

*Primary Examiner*—Gerard R. Strecker
*Assistant Examiner*—Warren S. Edmonds

[57] ABSTRACT

An apparatus of sensing a magnetic field using a ceramic superconductor magneto-resistive element having a superconductor magneto resistive effect of non linear characteristic against the applied magnetic field, there is provided a coil for applying a bias magnetic field to the magneto-resistive element, the coil is connected to a feed back power source for supplying current for holding the output of the magneto-resistive element constant value, whereby the applied magnetic field is measured by the current supplied to the coil.

There is disclosed also a device for sensing a magnetic field using a magneto-resistive element comprising a superconductor member having weak coupling grain boundaries, said device comprising means for applying A.C. bias magnetic field to said element, and means for taking out an output voltage of the element generated by application of the bias magnetic field as the signal representing the intensity of the applied magnetic field.

8 Claims, 10 Drawing Sheets

A.C. magnetic field operation point A operation point B operation point C operation point D operation point E

APPARATUS FOR SENSING A MAGNETIC FIELD WITH A SUPERCONDUCTIVE MATERIAL

This application is a division of copending application Ser. No. 07/773,765, now U.S. Pat. No. 5,254,945 filed on Oct. 10, 1991, which was a continuation of Ser. No. 07/544,899, filed Jun. 28, 1990, now abandoned. The entire contents of which are hereby incorporated by reference.

BACKGROUND OF THE INVENTION

1. Field of the Invention

The present invention relates to a method and device for sensing a magnetic field with use of a magneto-resistive property of a supercoductive material. The superconductive material contains grain boundaries.

2. Description of the Prior Art

Conventionally, a magnetic sensor which utilizes the Hall effect of magneto-resistive effect in a semiconductor or a magnetic sensor which utilizes the magneto-resistive effect in a magnetic material is widely used for sensing or measuring a magnetic field. These sensors have a limit of resolution of sensing a magnetic field of about $10^{-3}$ gauzes. Conventionally, for sensing a weak magnetic field, SQUID (superconductive Quantum Interference Device) has been used. However, SQUID needs the Josephson junction which utilizes thin insulation layer between two thin superconductors. Squid devices require a high production technology and it is not easy to produce the SQUID devices. In addition, in order to sense a magnetic field, it is necessary to cool the SQUID, to eliminate noise and to process the output signals from the SQUID, therefore to handle the SQUID for the measurement of the magnetic field is not easy.

The inventors of the present invention have found that the superconductive state of a ceramic superconductive element comes to break the superconductive state by application of a small magnetic field due to the grain boundary property and to have a resistance which increases abruptly corresponding to increment of the applied magnetic field and they propose a new magnetic field sensor utilizing the magneto-resistive effect in the U.S. patent application, Ser. No. 226,067, now U.S. Pat. No. 5,011,818 issued Apr. 30, 1991. The magnetic sensor using the ceramic superconductor mentioned above is expected as the superconductor magnetic sensor having a high sensitivity with easy operation and handling in addition to easy production partly because the sensor has a large resistivity increasing factor at the time of application of such a magnetic field that the superconductive condition is broken and the structure of the device is simple and the control of the sensitivity of the device can be easily made by the application of current, partly because the measurement output can be easily obtained.

However, the property of the superconductor magneto-resistive element as mentioned above is non linear in terms of the resistance and the applied magnetic field, therefore, it is difficult to calculate an absolute intensity of applied magnetic field based on the resistance value of the element.

Besides, there have been used various kinds of magnetic field sensor using high speed electron mobility semiconductors such as In Sb and In As, and ferro magnetic metal such as Fe-Ni, Co-Ni.

However, the conventional magnetic field sensor using the above material is difficult to sense a weak magnetic field accurately.

SUMMARY OF THE INVENTION

An essential object of the present invention is to provide a method of sensing the intensity of applied magnetic field accurately with a simple magnetic sensor.

In order to accomplish the purpose mentioned above, according to the method of measuring magnetic field according to the present invention, a magneto-resistive element having a superconductor magneto-resistive property is provided with means for applying a bias magnetic field using a coil, whereby the intensity of the bias magnetic field is so controlled as to cause the resistance value of the magneto-resistive element to be coincided with a set resistance value at which the sensitivity of the element is high. Since it is previously known that the intensity of the magnetic field to make the magneto-resistive element in the set resistance value, it is possible to accurately adjust the bias magnetic field utilizing the property of the magneto-resistive element in the high sensitivity state, and the intensity of the magnetic field can be represented by the amount of the current of the coil, whereby the outer magnetic field can be calculated based on the difference on the above mentioned two magnetic fields.

Referring to FIG. 4 showing a typical characteristics of a superconductor magneto-resistive element. In FIG. 4, the horizontal axis represents the intensity of the magnetic field applied to the element and the curve (a) in a solid line represents the resistance (ohm) of the element scaled by the left vertical axis and the curve (b) in dotted lines represents the increase rate (ohm/gauss) of the element against the applied magnetic field scaled by the right vertical axis.

The curve (a) shows that the magneto-resistive element has no resistance when the applied magnetic field is extremely weak and the element has a resistance suddenly when the applied magnetic field exceeds a predetermined intensity and the resistance increases abruptly as the applied magnetic field increases. This characteristic shows that a high sensitive measurement of a magnetic field can be realized by using the region in the curve (b) where the increase rate of the resistance of the element is abrupt.

Moreover, the curve (a) shows that the relation between the resistance of the element and the intensity of the applied magnetic field is not linear and that it is difficult to calculate the absolute value of the intensity of the applied magnetic field accurately.

In another aspect of the present invention, there is provided a device for sensing a magnetic field using a magneto-resistive element comprising a superconductor member having weak coupling grain boundaries, there is provided with means for applying A.C. bias magnetic field to said element, and means for taking out an output voltage of the element generated by application of the bias magnetic field as the signal representing the intensity of the applied magnetic field.

DETAILED DESCRIPTION OF THE PREFERRED EMBODIMENTS

First, a method of the production of a ceramic superconductor magneto-resistive element used in the following embodiments and its structure and property are explained.

Figure 5:
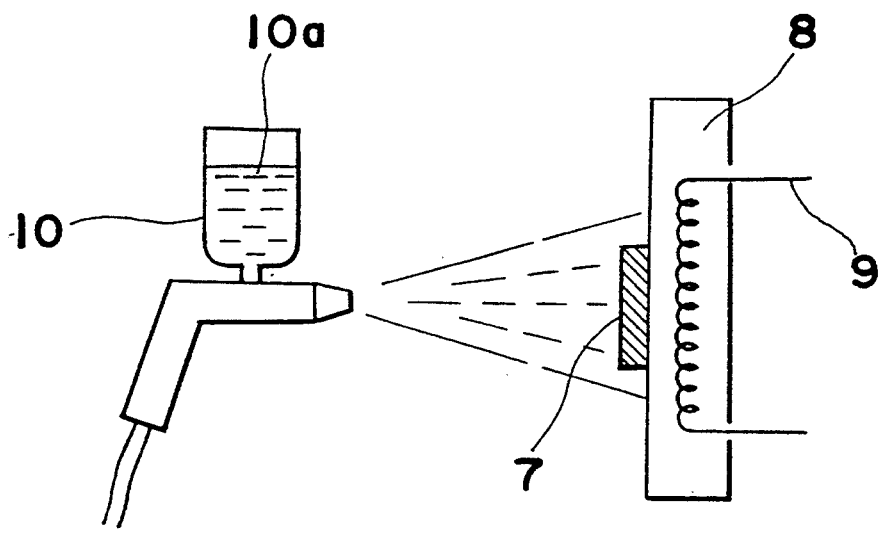
FIG. 5 is a schematic diagram showing an example of an arrangement for producing a ceramic superconductor film used in the embodiments of the present invention.

FIG. 5 shows a summary of the production method of the superconductor magneto-resistive element by a spray pylorysis.

The ceramic superconductor film is made of composition of $YBa_2Cu_3O_{7-\delta}$ and a substrate 7 made of stabilized zirconia on which the ceramic superconductor film is formed is placed on a base plate 8 heated at 350° C. by a heater 9. On the other hand, compositions of nitrate of elements of the ceramic superconductor represented by $Y(NO_3)_3.6H_2O$, $Ba(NO_3)_2$ and $Cu(NO_3)_2.H_2O$ were measured and solved in solution and the solution was saved in a tank of a sprayer 10. The saved solution was made to fine moisture under high pressure air or high pressure nitrogen gas by the sprayer 10 and sprayed to the substrate 7. The moisture reaching the substrate 7 formed a ceramic layer by the heat of the substrate 7. The ceramic layer was annealed in air at 950° C. for 5 minutes, whereby the film having superconductor characteristic were obtained. The superconductor layer thus obtained showed a resistance property that was decreased from 100K and the resistance was lost at 81K and brought into the superconductor state.

Figure 6:
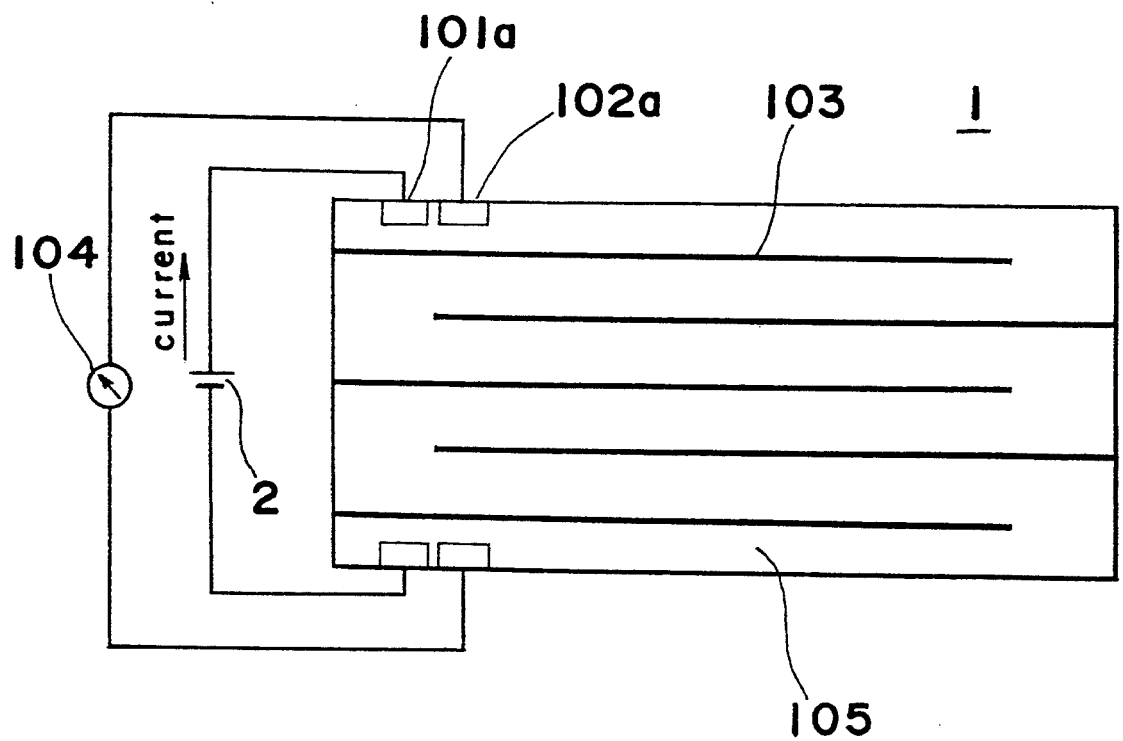
FIG. 6 is a plan view of a superconductor magneto-resistive element employed in the embodiments.

The superconductor film formed as mentioned above is made in a meander shape by cutting the superconductor film by slits 103 by a machine as shown in FIG. 6, and current terminals 101a and 101b and voltage electrodes 102a and 102b are formed on the superconductor film by vaporing Ti. This film is installed and sealed in a package made of anti magnetic material with dry nitrogen gas so that the superconductor magneto-resistive element 1 is obtained.

The current terminals 101a and 101b are connected to a stabilized current source 2 to flow a constant current and the resistance generated in the superconductor magneto-resistive element 1 is measured by a voltage. generated across the voltage terminals 102a and 102b which is measured by a volt meter 104.

Figure 7:
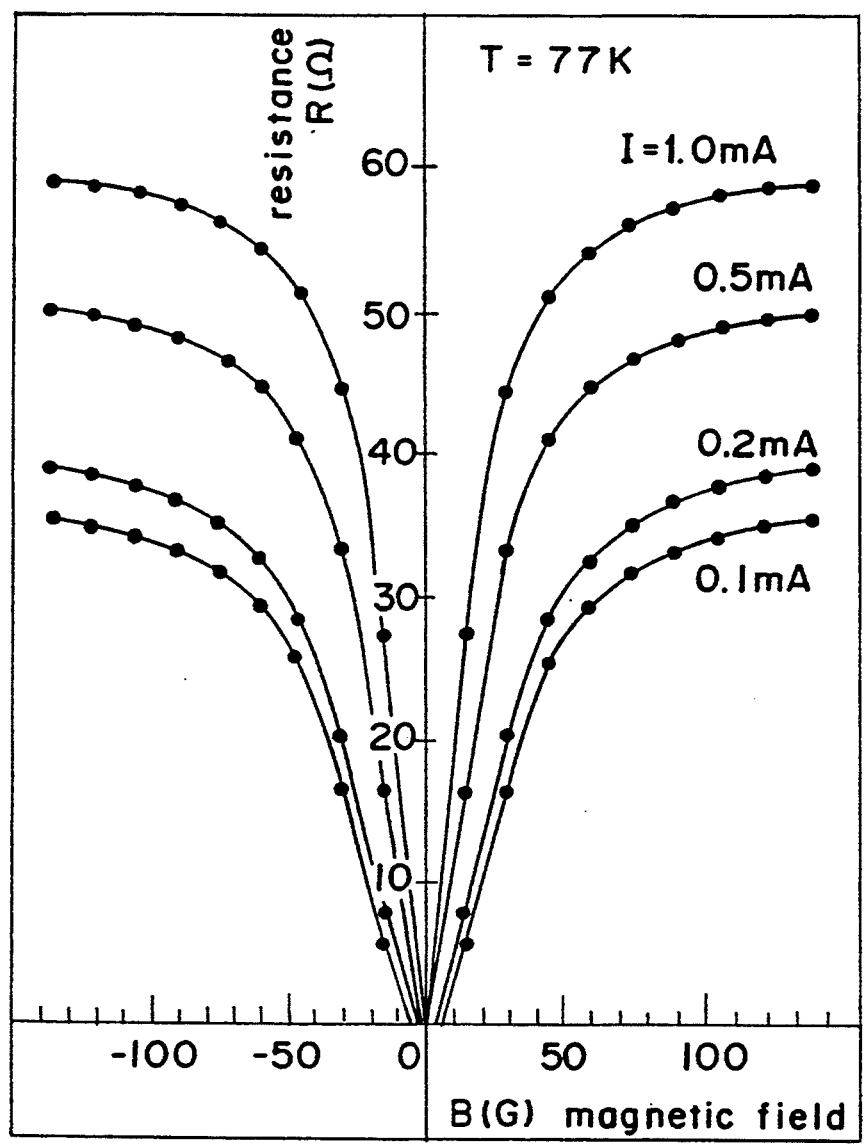
FIG. 7 shows characteristic curves of the superconductor magneto-resistive elements.

FIG. 7 shows a characteristic by changing the bias current of the superconductor magneto resistive element 1. FIG. 7 is a graph measured when the element is held at 77K of liquid helium temperature, the horizontal axis corresponds to the intensity of the magnetic field applied to the element 1 and the vertical axis to the resistance generated in the element 1. The current values attached to the respective curves are the bias currents applied to the element 1 through the current terminals 101a and 101b. As understood from the graphs FIG. 7, the magneto-resistance generated in the element 1 increases corresponding to the increase of the bias current and the critical magnetic field which the resistance occurs is decreased.

First Embodiment

Figure 1:
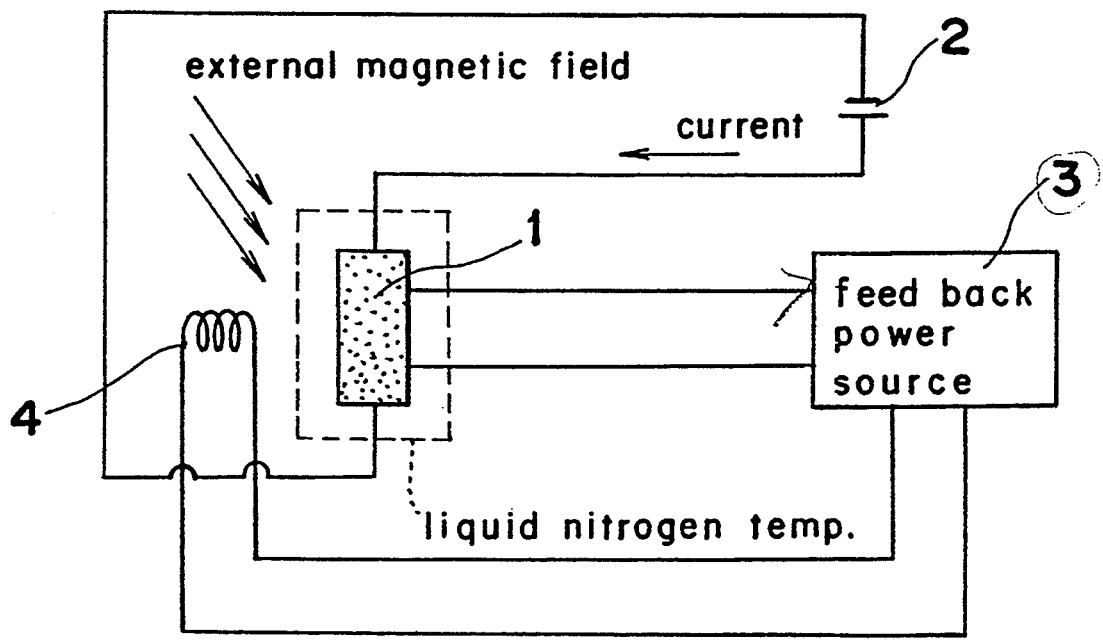
FIG. 1 is a schematic diagram showing an arrangement for performing a first embodiment of the method of sensing a magnetic field according to the present invention.

FIG. 1 shows the first embodiment according to the present invention which uses the superconductor magnetoreistive element 1.

The embodiment is such that the output voltage of the element 1 is being measured and a feedback current is flown through a bias magnet field coil so as to hold the output voltage of the element 1 constant, whereby the external magnetic field is measured by the bias current value.

In the embodiment shown in FIG. 1, the element 1 is cooled at 77K and a current 1 mA is supplied to the element 1 from the stabilized current source 2. The output voltage obtained by the application of the external magnetic field is inputted to the feed back source 3. The input voltage is compared to a reference voltage and the power source 3 controls the current flowing through a coil 4 which applies a bias magnetic field to the element 1 so that the difference between the input voltage and the reference voltage is as small as possible.

The coil 4 is a copper wire that is wound ten turns so that there can be obtained 10 gauss/A of the magnetic field applied to the element 1 against the current passed through the coil 4.

In the measuring device as mentioned above, the standard output voltage of the element 1 was set at 2 mV and the current to the coil 4 for applying the magnetic field was controlled so as to decrease the difference from the standard voltage by operating the feed back power source 3. In the arrangement of the first embodiment, since the current resolution was 10 $\mu A$, due to the noise level, the magnetic resolution in the first embodiment was $10^{-4}$ gauss.

Second Embodiment

Figure 2:
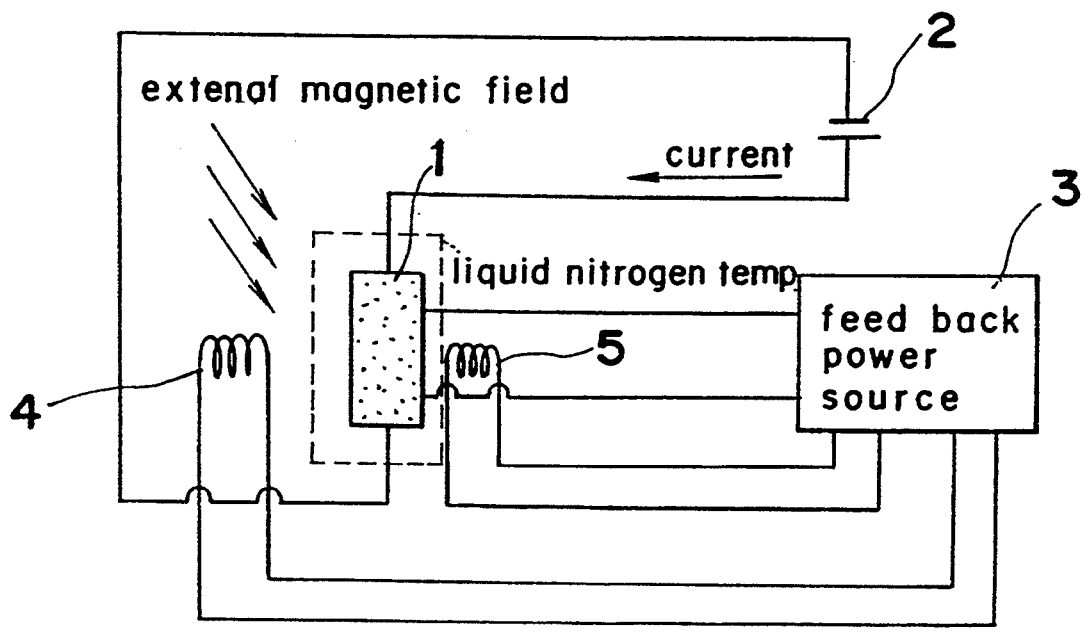
FIG. 2 is a schematic diagram showing an arrangement for performing a second embodiment of the method of sensing a magnetic field according to the present invention.

The second embodiment of the present invention is shown in FIG. 2.

The second embodiment is substantially the same as the first embodiment except that a modulation magnetic coil 5 is added so as to apply an A.C. bias magnetic field to the element in addition to the D.C. bias magnetic field and that only the A.C. voltage component of the output voltage of the element 1 is supplied to the feedback source 3 so that the current to the coil 4 for applying the bias magnetic field is controlled so as to hold the output voltage of the element 1 equal to the standard voltage. The operation of the device is substantially the same as that in the first embodiment except for the above two points and the explanation of the same portions is herein omitted. Both coils 4 and 5 are spaced a distance from element 1 and do not surround element 1 as illustrated in FIG. 2.

In the second embodiment, output voltage of amplitude of A.C. 2 mV were obtained in the element 1 when A.C. current of 1 mA of peak value, 100 Hz was supplied to the modulation coil 5. The A.C. output could be amplified in synchronism with the period of the modulation magnetic field and the the effect of noise could be reduced, whereby the magnetic solution could be made to $10^{-5}$ gauss.

Third Embodiment

Figure 3:
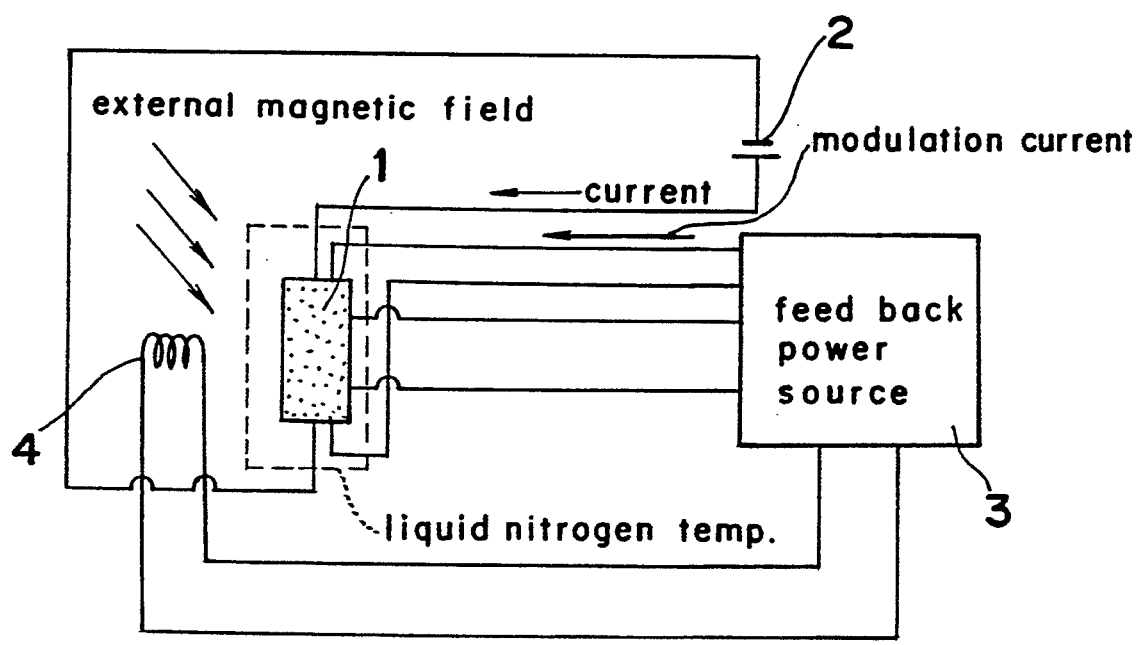
FIG. 3 is a schematic diagram showing an arrangement for performing a third embodiment of the method of sensing a magnetic field according to the present invention.
Figure 4:
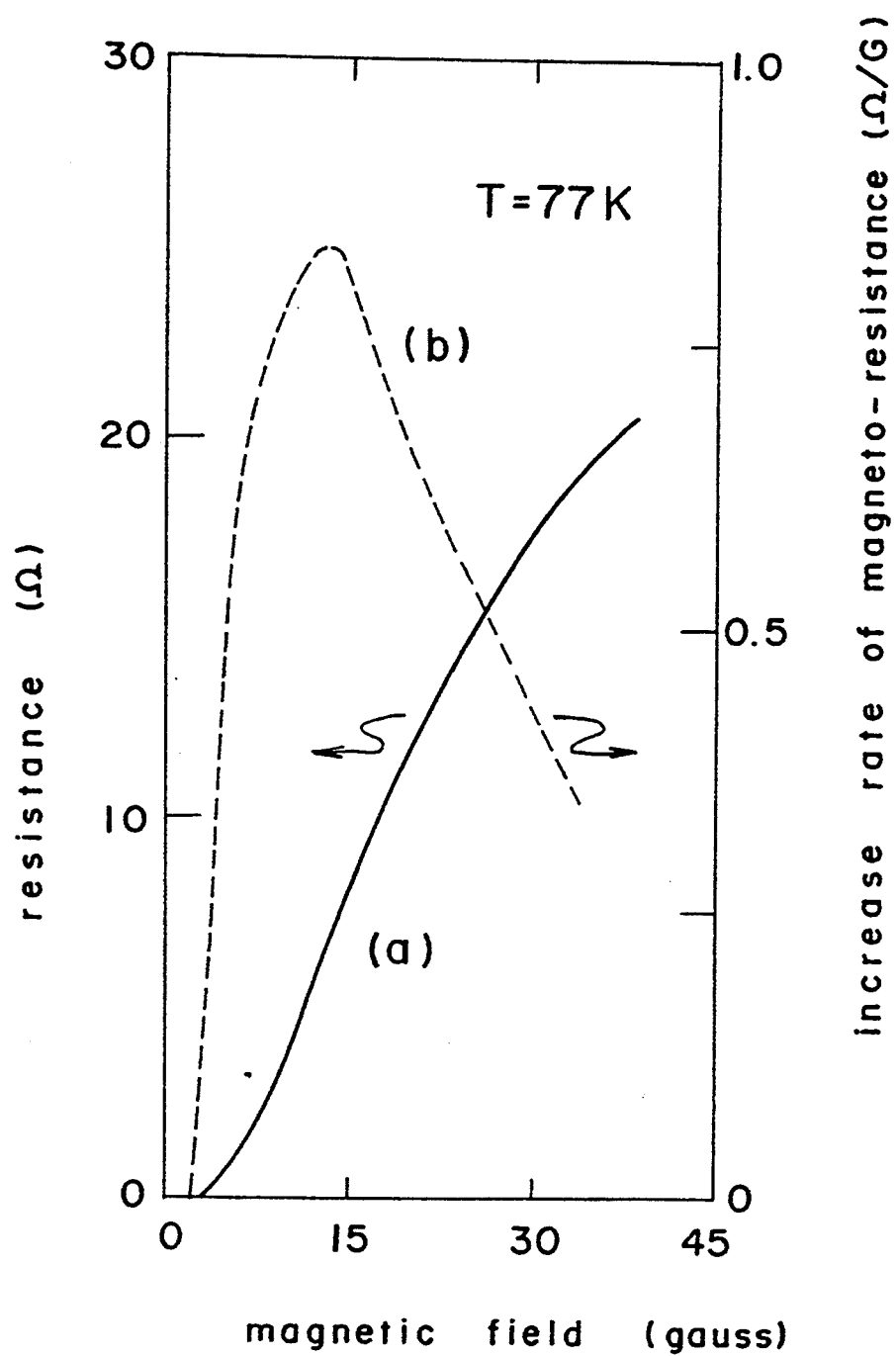
FIG. 4 is a schematic diagram showing characteristic curves of the superconductor magneto-resistive element.

FIG. 3 shows the third embodiment of the present invention. The third embodiment is substantially the same as the first embodiment except that A.C. modulated current is added to the bias current and that only the A.C. component is taken from the element 1 as same as in the second embodiment. The output from the element 1 was synchronizing amplified, and the magnetic field solution was $5 \times 10^{-5}$ gauss by the noise by the bias current of the element 1.

The above embodiments are mentioned only as examples of performing the method of the magnetic field sensing using the superconductor magneto-resistive effect according to the present invention, but the method according to the present invention is not limited to the method by the shape and connection in the above embodiments.

The ceramic superconductor film of the superconductor magneto-resistive element in the above embodiments is explained by Y—Ba—Cu—O film made by the spray pyrolysis method, the materials may be any superconductor materials of Bi—Sr—Ca—Cu—O and Tl—Ba—Ca—Cu—O so long as the materials have weak coupling at the grain boundaries and a high non linear sensitivity against the magnetic field and there may be used the sputter method, electron beam method or CVD method as the film forming method.

Fourth Embodiment

Figure 9:
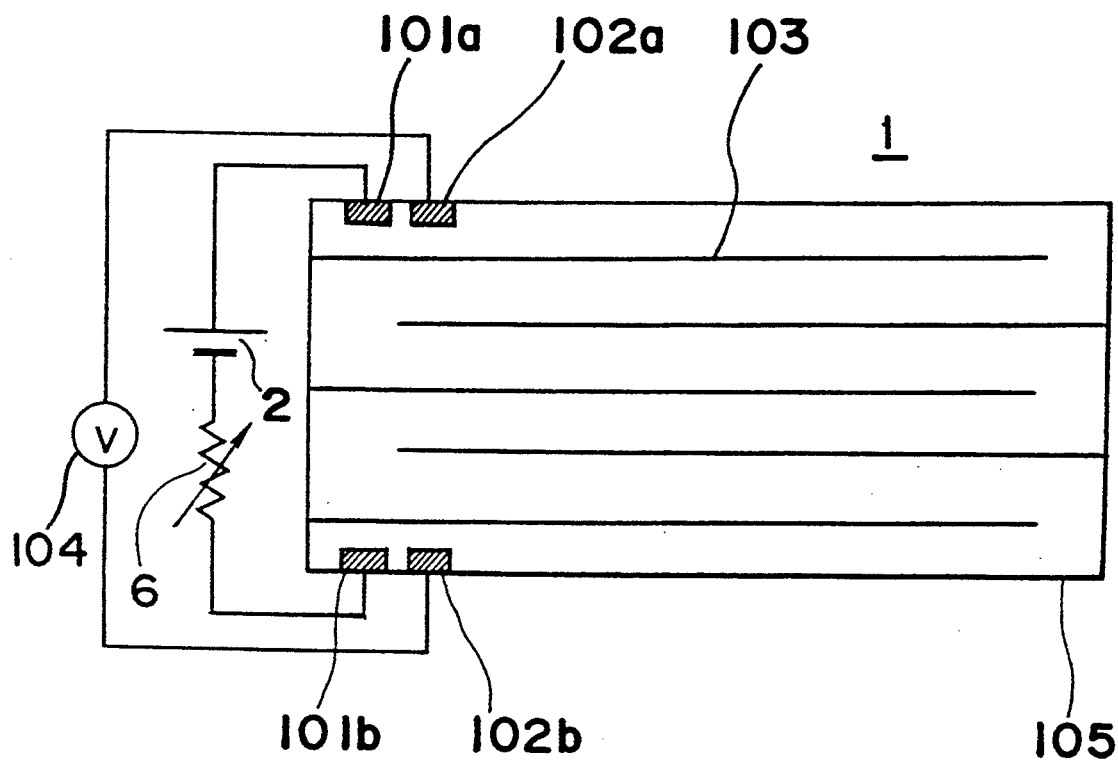
FIG. 9 is a plan view showing an embodiment of the superconductor magneto-resistive element.
Figure 10:
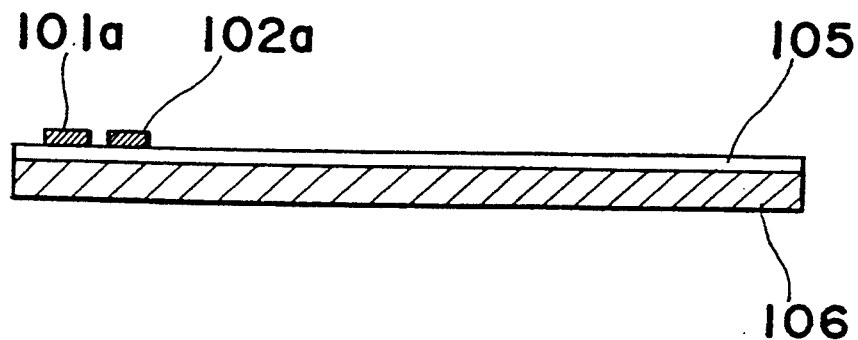
FIG. 10 is a cross sectional view of FIG. 9.

FIG. 9 shows a further example of the superconductor magneto-resistive element used in the fourth embodiment of the present invention in which the element 1 per se is substantially the same as the element shown in FIG. 6, except that the stabilized current source 2 is connected to the element 1 through a current controller 6. The like parts in FIG. 6 and FIG. 9 are numbered by the like reference numerals and the detailed explanation thereof is herein omitted.

The ceramic superconductor film in this embodiment was made in such a manner that $Y(NO_3)_3 \cdot 6H_2O$, $Ba(NO_3)_2$ and $Cu(NO_3)_2 \cdot H_2O$ were measured and solved in solution and the solution was saved in a tank of a sprayer 10. The saved solution was made to fine moisture under high pressure air or high pressure nitrogen gas by the sprayer 10 and sprayed to the substrate 7. The moisture reaching the substrate 7 formed a ceramic layer by the heat of the substrate 7 which is heated at 600° C. The superconductor film was made as 10 μm thick and was subjected to a thermal treatment in air.

A good result can be obtained when the superconductor film is made with 1 μm to 10 μm thick.

Figure 8:
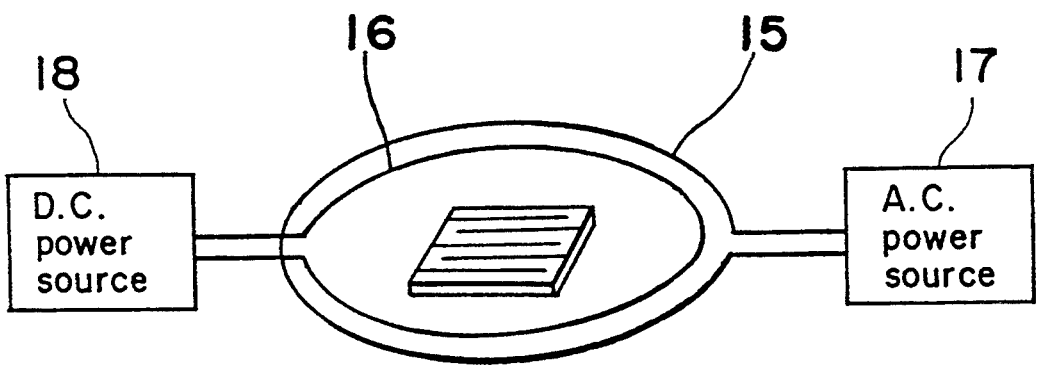
FIG. 8 is a schematic diagram showing a general structure of the superconductor magneto-resistive element according to the present invention.

The superconductor magneto-resistive element 1 shown in FIG. 9 is set at a center of two coils 14 and 15, as shown in FIG. 8, which apply bias magnetic fields in the same direction. The measurement by the arrangement shown in FIG. 8 was made in a magnetically shielded room.

The coil 15 is connected to a A.C. power source 17 and the coil 16 is connected to a D.C. power source 18 so as to apply the A.C. magnetic field and the D.C. magnetic field to the element 1.

Figure 11:
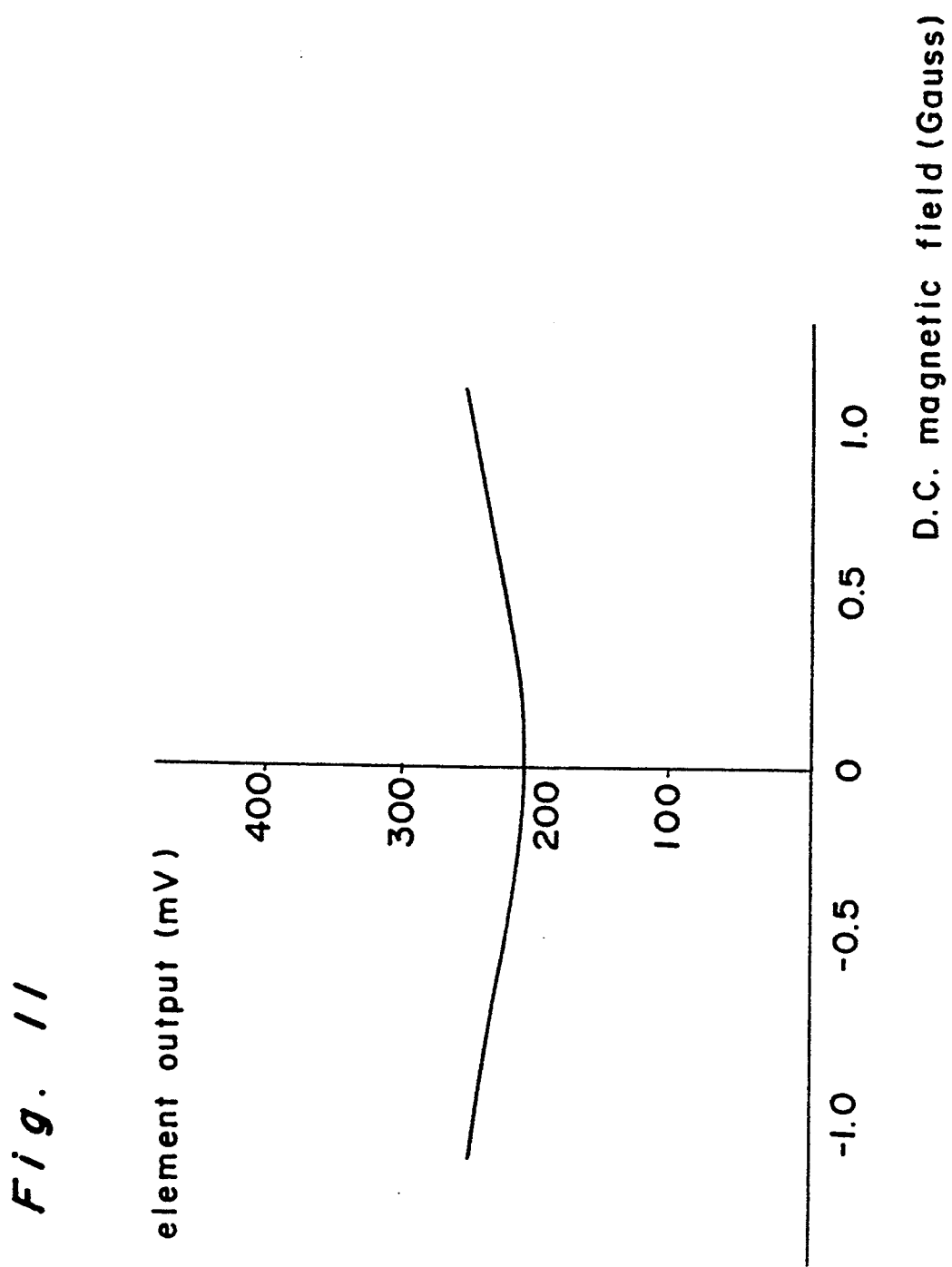
FIG. 11 is a characteristic curve between D.C. bias and output of the superconductor magneto-resistive element used in the embodiments.

FIG. 11 shows one example of the output characteristic of the element 1 as mentioned above. The output characteristic in FIG. 11 was obtained under such a condition that a bias current of 10 mA was supplied to the current terminals 101a and 101b of the element 1 and the D.C. bias magnetic field is applied by the coil 16. The vertical axis of FIG. 11 shows the output of the element 1 and the horizontal axis of FIG. 11 shows the intensity of the D.C. bias magnetic field.

Figure 12:
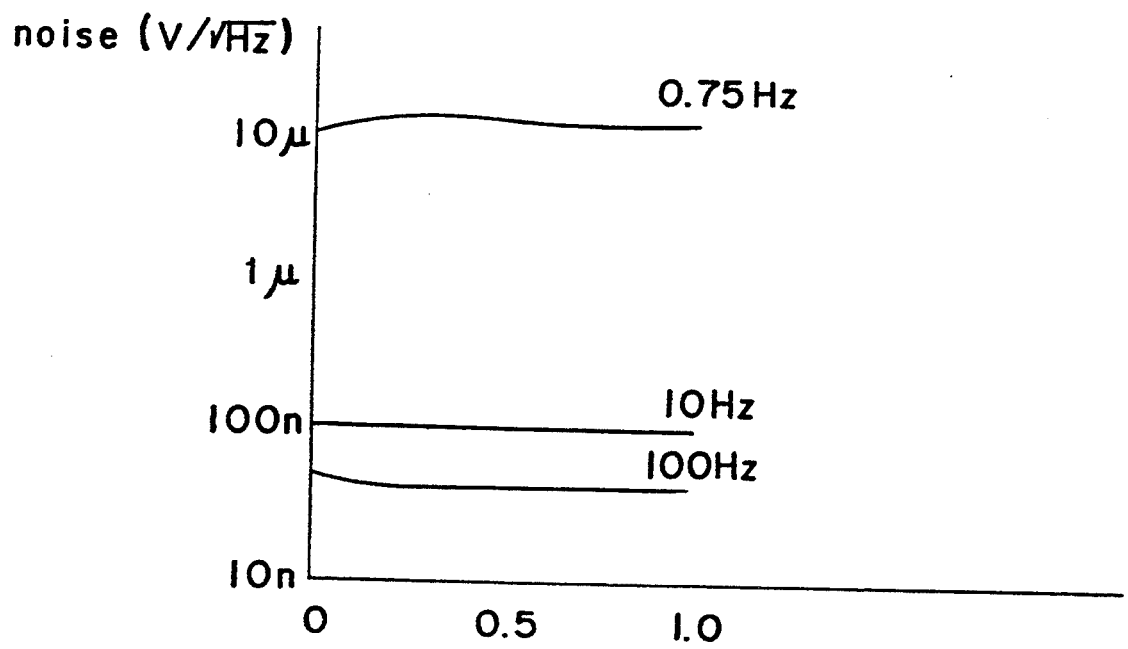
FIG. 12 is characteristic curves between D.C. bias magnetic field and noise of the superconductor magneto-resistive element.

In FIG. 12, the vertical axis of the graph shows intensity of noise included in the output of the element 1 in various frequencies when the element is operated under the same condition as shown in FIG. 11 with the D.C. bias magnetic field changed as shown in the horizontal axis in FIG. 12.

From FIG. 12, it is understood that the change of the noise of the element 1 by the change of the intensity of the applied magnetic field is small but the noise of the low frequency below several hertz is relatively large, whereby FIG. 12 shows that a precise measurement of D.C. and low frequency magnetic field is difficult.

According to the present embodiment, D.C. and low frequency magnetic field can be precisely measured without the effect of the noise by the measurement method shown in the various embodiments already mentioned.

FIGS. 13(a) to (f) show A.C. wave forms in one example of the present invention with the arrangement shown in FIG. 8 in which a sinusoidal magnetic field of ±100 miligauss of 100 Hz as shown in FIG. 13(a) is applied to the element 1 by the coil 15.

Figure 14:
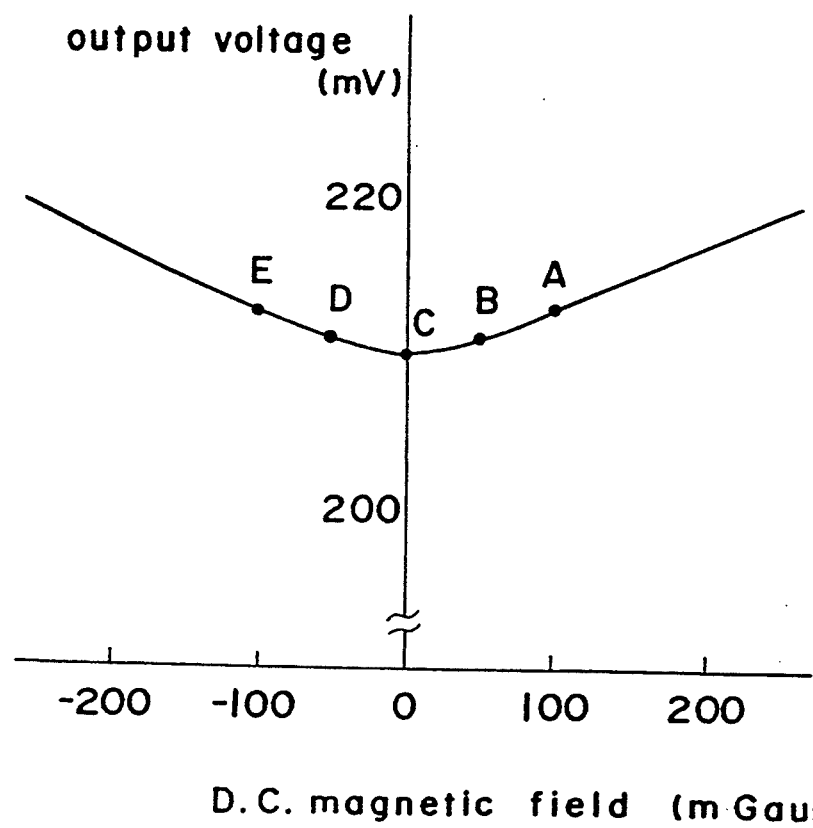
FIG. 14 is a schematic diagram showing the operation point of FIG. 13.
Figure 13:
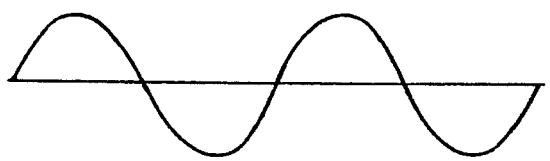
FIGS. 13(a) to 13(f) are schematic diagrams showing output wave forms against the D.C. bias values.
Figure 13:
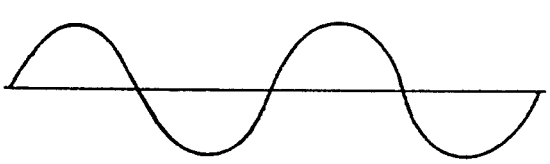
Figure 13:
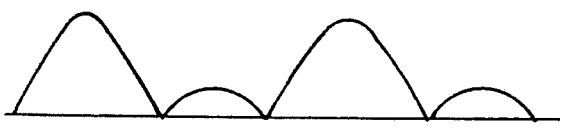
Figure 13:
Figure 13:
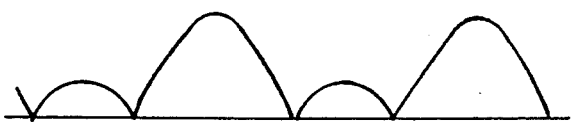
Figure 13:
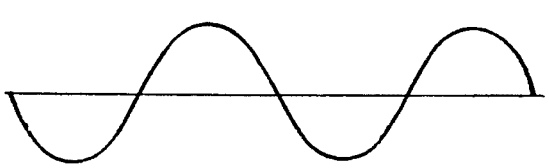
Figure 15:
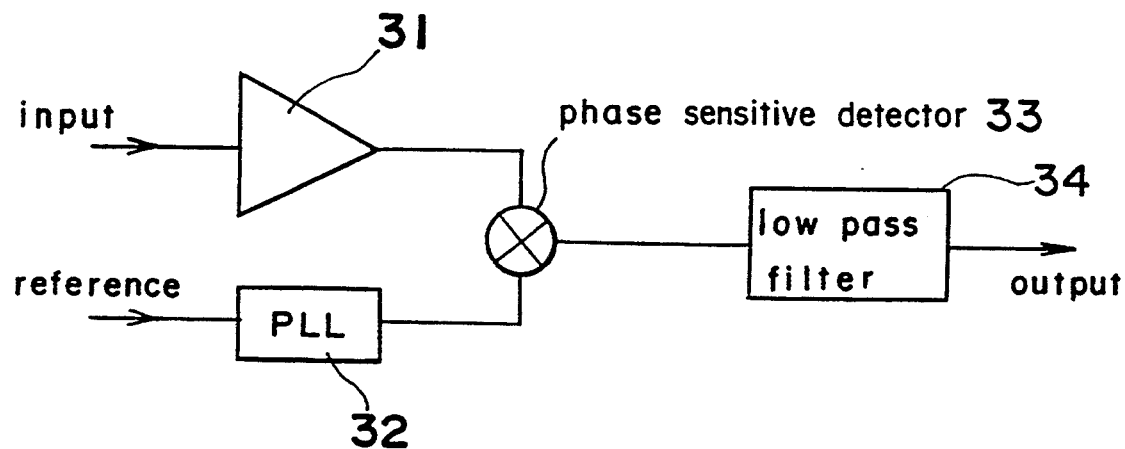
FIG. 15 is a circuit diagram of a lock in amplifier.

Under the condition that the A.C. current is supplied to the coil 15, a predetermined D.C. current is supplied to the coil 16. When various intensities of the D.C. bias magnetic field shown by the points A, B, C, D and E in FIG. 14 having the contents explained in relation to FIG. 11 is applied, the wave forms generated at the output of the element 1 corresponding to the above intensities of the magnetic field are as shown in FIGS. 13 (b), (c), (d), (e) and (f).

The outputs as mentioned above and the A.C. magnetic field generating signals are inputted to a lock-in amplifier, and since only 100 Hz component only is taken out with a narrow band, it becomes possible to suppress the effective value of the noise.

Figure 16:
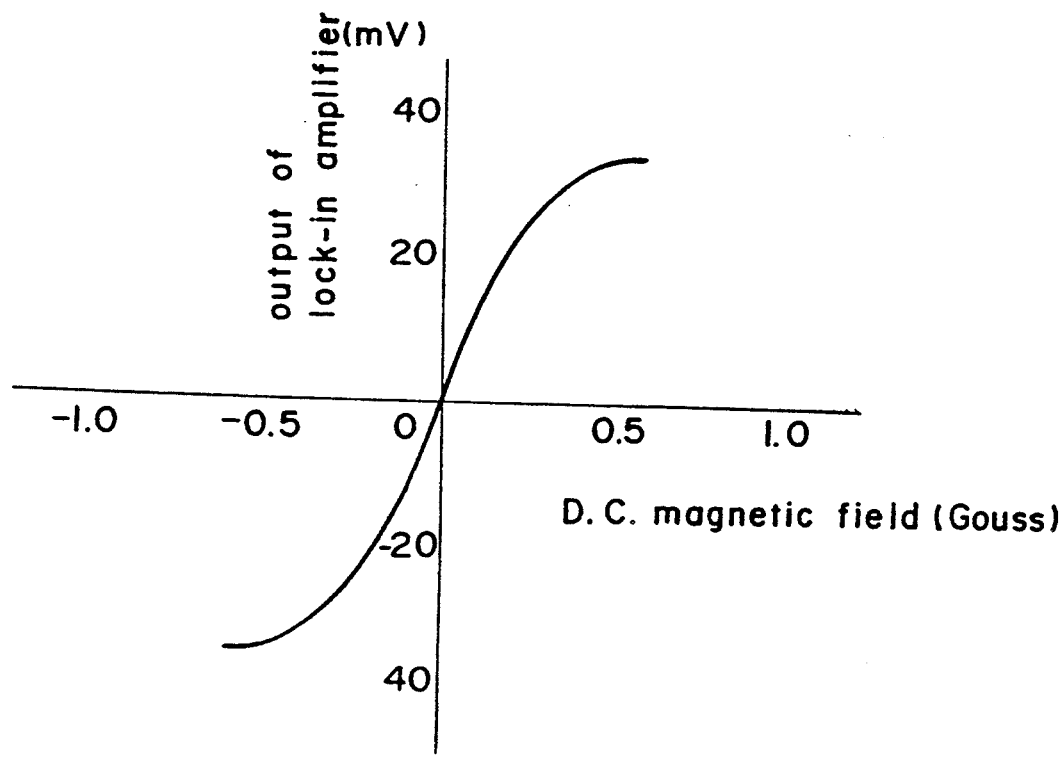
FIG. 16 is an output characteristic curve of the lock in amplifier against the D.C. magnetic field.

The general structure of the lock-in amplifier is shown in FIG. 16. The output from the voltage terminals 102a and 102b of the element 1 is amplified by 20 times with an amplifier 31 and inputted to the lock-in amplifier. On the other hand, the 100 Hz signals of the sine wave generator is used as the reference input.

A reference voltage is supplied to th phase lock loop denoted as 32.

The principle of the lock-in amplifier is as follows.

It is assumed that the input signal Vs and the reference signal Vr are represented by the following equations.

$$Vr = A \cos(\omega r\, t + \theta) \text{tm} \quad (1)$$

$$Vs = \cos(\omega s\, t) \quad (2)$$

wherein A: constant, $\omega r$: angular speed of the reference signal, $\theta$: phase angle, $\omega s$: angular speed of the input signal.

By multiplying the above two equations in a phase sensitive detector 33, the following signal Vpsd can be obtained, $$\begin{aligned} Vpsd &= A\cos(\omega r\, t + \theta) \cdot \cos(\omega s\, t) \\ &= A/2\cos[(\omega r + \omega s)t + \theta] + A/2\cos[(\omega r - \omega s)t + \theta] \end{aligned} \quad (3)$$

Since $\omega r = \omega s$, the second term of the equation (3) becomes D.C. component. Since the A.C. component of the first term of the equation (3) is eliminated by a low pass filter 34, the output $V_{LP}$ from the low pass filter 34 is $$V_{LP} = A/2 \cos\theta.$$

In order to make $V_{LP}$ maximum, the lock-in amplifier is adjusted so as to make the phase difference of the reference signal and the input signal 0. As mentioned above, it is possible to take out the D.C. component from the frequency component by the A.C applied magnetic field.

By taking the horizontal axis as the intensity of the D.C. bias magnetic field when the current supplied to the coil 16 is changed and taking the vertical axis as the output of the lock-in amplifier, the result of the measurement is shown in FIG. 16. In FIG. 16, the differential magnetic sensitivity of the operation point by the applied D.C. magnetic field is measured as the lock-in amplifier output, however, when the D.C. magnetic field is nearly zero, the wave forms are depicted as FIGS. 13(c), (d), (e) by the output property of the superconductor magneto-resistive element 1, it is found that there is a liner portion in the present embodiment. In the device of the present invention, magnetic fields of D.C to several hertz can be measured in the solution of 0.1 mili gauss by setting the time constant of the low pass filter 34 as 100 milisecond using the linear portion.

The present invention is not limited to the above embodiment but it is possible to change the measurement range of the magnetic field to be measured and the accuracy of the measurement by adjusting the bias current to the superconductor magneto resistive element, intensity of the A.C. bias current, its frequency or presence and absence of the D.C bias magnetic field and change of the intensity of the D.C. bias magnetic field.

The A.C bias magnetic field and D.C bias magnetic field may be generated by one coil by supplying A.C current and D.C. current to one coil.

Also, it is possible to sense a magnetic field which changes more than several hertzs by adjusting the time constant of the low pass filter of the lock-in amplifier.

It is possible to provide the coil for applying the bias magnetic fields in the thin film shape on the substrate on which the superconductor magnetic resistive element is provided, whereby it is possible to stabilize the magnetic field sensing operation and to facilitate manufacturing of the magnetic field sensing device.

What is claimed is:

1. An apparatus for sensing externally applied magnetic fields comprising:
    a magneto-resistive element formed of a superconductor material having weak coupling grain boundaries,
    means spaced a distance from said element for applying an A.C. bias magnetic field to said element;
    means for applying another bias magnetic field to said element;
    means for outputting an output voltage of the element generated by application of the bias magnetic fields as a signal representing the intensity of the applied magnetic field; and means for receiving a voltage from the element and supplying a controlled current to the means for applying another bias magnetic field.

2. The apparatus according to claim 1, wherein said means for applying another magnetic field is a coil for applying a D.C. magnetic field.

3. The apparatus according to claim 2, wherein the apparatus is surrounded by a means for shielding.

4. The apparatus according to claim 2, wherein the means for applying, applies various intensities of the DC magnetic field so that wave forms generated at an output of the element are varied.

5. The apparatus according to claim 1, wherein the means spaced from said element is a coil.

6. The apparatus according to claim 2, wherein the means for receiving the voltage is a feedback power source.

7. The apparatus according to claim 2, wherein said another means is spaced from said element.

8. The apparatus of claim 5, wherein said each coil is in non-surrounding relationship to said element.

* * * * *